(12) United States Patent
Macionczyk

(10) Patent No.: US 11,555,239 B2
(45) Date of Patent: Jan. 17, 2023

(54) APPARATUS AND METHOD FOR INTRODUCING AN OPTICAL LENS INTO A TURNING DEVICE

(71) Applicant: Carl Zeiss Vision International GmbH, Aalen (DE)

(72) Inventor: Frank Macionczyk, Oberkochen (DE)

(73) Assignee: Carl Zeiss Vision International GmbH, Aalen (DE)

( * ) Notice: Subject to any disclaimer, the term of this patent is extended or adjusted under 35 U.S.C. 154(b) by 0 days.

(21) Appl. No.: 17/384,976

(22) Filed: Jul. 26, 2021

(65) Prior Publication Data

US 2021/0348264 A1  Nov. 11, 2021

Related U.S. Application Data

(63) Continuation of application No. PCT/EP2020/052141, filed on Jan. 29, 2020.

(30) Foreign Application Priority Data

Jan. 30, 2019 (EP) .................................. 19154471

(51) Int. Cl.
*G02C 7/00* (2006.01)
*C23C 14/50* (2006.01)
*C23C 16/458* (2006.01)
*G02C 7/02* (2006.01)

(52) U.S. Cl.
CPC ........ *C23C 14/505* (2013.01); *C23C 16/4584* (2013.01); *C23C 16/4585* (2013.01); *G02C 7/024* (2013.01)

(58) Field of Classification Search
CPC ... G02C 7/024; C23C 14/505; C23C 16/4584; C23C 16/4585

USPC .......................................................... 359/394
See application file for complete search history.

(56) References Cited

U.S. PATENT DOCUMENTS

| 3,449,866 | A | | 6/1969 | Suddarth |
| 5,124,019 | A | * | 6/1992 | Kunkel ................. C23C 14/505 |
| | | | | 118/729 |
| 8,356,808 | B2 | | 1/2013 | Macionczyk |

FOREIGN PATENT DOCUMENTS

| DE | 1652019 A1 | 8/1971 |
| DE | 10146542 A1 | 4/2003 |
| DE | 102004026523 A1 | 12/2005 |
| DE | 102006041137 A1 | 3/2008 |
| EP | 215261 A2 | 3/1987 |

(Continued)

OTHER PUBLICATIONS

Industrial Norm "Ophthalmic optics—Spectacle lenses—Vocabulary (ISO 13666:2012)," German and English version EN ISO 13666:2012, Oct. 2013.

(Continued)

*Primary Examiner* — Thomas K Pham
*Assistant Examiner* — Henry A Duong
(74) *Attorney, Agent, or Firm* — Tautz & Schuhmacher LLC; Georg Hasselmann

(57) ABSTRACT

An apparatus and a method for introducing an optical lens into a turning device are disclosed. The apparatus includes a carrier body and a carrier element for receiving the lens. The carrier element is arranged in the carrier body. The carrier element has a supporting surface for receiving the lens and is displaceably mounted in relation to the carrier body.

8 Claims, 2 Drawing Sheets

(56) References Cited

FOREIGN PATENT DOCUMENTS

EP      406484 A1    1/1991
EP     1295962 A1    3/2003

OTHER PUBLICATIONS

International Search Report issued in PCT/EP2020/052141, to which this application claims priority, dated Jun. 4, 2020, and English-language translation thereof.
Written Opinion issued in PCT/EP2020/052141, to which this application claims priority, dated Jun. 4, 2020.
International Preliminary Report on Patentability issued in PCT/EP2020/052141, to which this application claims priority, dated May 11, 2021, and English-language translation thereof.

* cited by examiner

APPARATUS AND METHOD FOR INTRODUCING AN OPTICAL LENS INTO A TURNING DEVICE

CROSS REFERENCE TO RELATED APPLICATIONS

This application is a continuation application of international patent application PCT/EP2020/052141, filed Jan. 29, 2020, designating the United States and claiming priority from European patent application 19154471.7, filed Jan. 30, 2019, and the entire content of both applications is incorporated herein by reference.

TECHNICAL FIELD

The present disclosure relates to an apparatus and a method for introducing an optical lens, typically a spectacle lens, into a turning device and a method for producing at least one spectacle lens. Here, the apparatus and the method can be configured, in particular, to introduce the spectacle lens into the turning device under the application of as little force as possible and with as little friction as possible, in particular to introduce the spectacle lens into the turning device for the purpose of forming a two-sided coating of the spectacle lens in a vacuum coating installation.

BACKGROUND

The related art has disclosed apparatuses and methods for introducing optical lenses, typically spectacle lenses, into a turning device. Such apparatuses and methods have been used for a relatively long time, particularly in the industrial manufacture of spectacle lenses.

DE 16 52 019 A1 discloses means for ablating excess glass from the edges of a spectacle lens blank and means that can be used to quickly align a lens blank to be edged with respect to an edging apparatus, quickly clamp the lens blank and remove the latter from the apparatus. To this end, a tensioning member tensions the lens blank by means of a rubber head in relation to a retaining arm, while a bearing shell receives the vibrating member. During operation, the front of the lens blank is introduced against the tensioning member on the outer surface of the vibrating member, which has a supporting surface for receiving the lens blank. Here, the vibrating member is mounted to be displaceable by means of a spring in relation to the bearing shell.

EP 0 215 261 A2 discloses a holder for a spectacle lens in the form of an elastically deformable ring, which, on its inner side, has yokes for receiving the spectacle lens to be held.

EP 0 406 484 A1 discloses that, in the case of a lens holder, in particular for spectacle lenses to be coated in a high vacuum vapor deposition installation or a sputtering installation, the lens holder being substantially embodied as a ring carrying the lens to be held, the ring, in turn, being connectable to a substrate holder held in the vicinity of the coating source in the process chamber of the high vacuum installation, the lens can be inserted between two rings which can be tensioned against one another by way of wire springs, wherein the first ring is provided with ramps on its outer lateral surface, the ramps interacting with the wire springs that are fastened on the radial outer lateral surface of the second ring, and wherein at least one of the rings has two diametrically opposite pins at its radial outer lateral surface, by means of which pins the ring is supported in corresponding bearing yokes of the substrate holder and in which the ring is rotatable through approximately 180°.

DE 101 46 542 A1 and EP 1 295 962 A1 each disclose a method for machine-based handling of a spectacle lens, wherein the spectacle lens is secured in a holder for the duration of the handling and the combination of holder and spectacle lens is guided through at least one handling or method step. To this end, a holder is proposed, which has holding means for the spectacle lens in a receptacle opening, wherein the holding means are formed by a clamping section of the holder itself or configured as a spring element.

DE 10 2004 026 523 A1 discloses an interchangeable frame for receiving an optical component comprising a planar main body, which has a perforation with a form corresponding to the optical component to be received. Moreover, the interchangeable frame has notches in the main body, which extend from the perforation and which are provided for contactless immersion of clamping elements and/or holding elements present at the edge region of the optical component when the optical component is handled.

DE 10 2006 041 137 A1 discloses an apparatus and a method for turning an ophthalmic plastic lens in a vacuum coating installation, comprising a holder, rotatably mounted about an axis of rotation, for the lens and comprising a turning device that turns the holder about the axis of rotation. Here, provision is made for the turning device to generate a force, more particularly a magnetic force, which turns the holder without mechanical coupling between the turning device and the holder.

Despite numerous advantages, these apparatuses and methods still have potential for improvement. Particularly when using the apparatus of DE 10 2006 041 137 A1, it may be disadvantageous if a spectacle lens is clamped in a turning ring in such a way that the center of gravity of the spectacle lens is situated higher up than the center of the axis of rotation of the turning ring. This is because the turning ring with the clamped spectacle lens may fall back into an initial position before the turning procedure has been completed if the center of gravity of the spectacle lens is located too far away from the axis of rotation of the turning ring. The turning procedure of a turning ring is not fully completed if the magnetic field, which was activated to turn the turning ring, is deactivated before the turning ring was completely turned. By way of example, this may occur at the end of a turning procedure for the last spectacle lens to be turned on a spherical cap collar, particularly if the magnetic field is deactivated before the turning ring on the same collar, already turned at the start of the turning procedure, was attracted thereby again.

SUMMARY

It is an object of the present disclosure to provide an apparatus and a method for introducing an optical lens, typically a spectacle lens, into a turning device and a method for producing at least one spectacle lens, which at least partially overcome the stated disadvantages and limitations of the related art.

In particular, it should be possible to introduce the lens into the turning device at any desired predefinable point of the turning device over a large range, typically in such a way that this can bring a center of gravity of the lens in line with an axis of rotation about which the turning device is rotatably mounted.

This object is achieved by an apparatus and a method for introducing an optical lens, typically a spectacle lens, into a turning device and a method for producing at least one spectacle lens, wherein the center of gravity of the spectacle lens can be brought in line with an axis of rotation about which the turning device is rotatably mounted. Exemplary embodiments, which can be realized individually or in combination, are presented below.

Hereinafter the terms "exhibit," "have," "comprise," or "include" or any grammatical deviations therefrom are used in a non-exclusive way. Accordingly, these terms can refer either to situations in which, besides the feature introduced by these terms, no further features are present, or to situations in which one or more further features are present. For example, the expression "A exhibits B," "A has B," "A comprises B," or "A includes B" can refer both to the situation in which no further element aside from B is provided in A, that is to say to a situation in which A consists exclusively of B, and to the situation in which, in addition to B, one or more further elements are provided in A, for example element C, elements C and D, or even further elements.

In a first aspect, the present disclosure relates to an apparatus for introducing an optical lens into a turning device.

In principle, the term "turning device" describes any apparatus configured for temporary or permanent reception of an article and having a predetermined axis of rotation, about which the apparatus is rotatably mounted. Here, the article encompassed by the present disclosure relates to an optical lens, typically a spectacle lens. For the purposes of receiving the lens, the turning device has at least one holder, in which the lens is secured during a period of time, in particular in order to guide a combination of the turning device and lens through at least one method step. Here, as a matter of principle, the holder can have any configuration and, in particular, have at least one frame and at least one holding means attached or introduced into the frame, which holding means is configured to hold the lens in a receptacle opening formed by the holding means. Here, the term "holding means" denotes a device on the holder which represents or forms the receptacle opening for receiving the lens. Additionally, the holder itself may have further elements, in particular the frame for attaching or introducing the holding means.

As disclosed in DE 101 46 542 A1 and EP 1 295 962 A1, for example, the holding means can be formed by a clamping section of a holding body or can be configured as a spring element. To this end, the holding means can have a body, referred to as "holding body," wherein the holding means can have an integral or multi-part configuration. In an exemplary embodiment, the holding body can have at least one element which is configured to secure the lens on the holding body by way of a clamping procedure. Here, the element configured for the clamping procedure can be part of the holding body, and can consequently be referred to as "clamping section." Consequently, the holding means can have an integral configuration in this case. Alternatively, the element configured for the clamping procedure can be available as a separate element and can be fastened to the holding body. Consequently, the holding means has a multi-part configuration in this case. In a further configuration, the holding means can be or comprise a spring element, the term "spring element" relating to a component having windings that can be mechanically deformed and can therefore be used as a receptacle opening for receiving the lens. However, other types of holding means are possible.

As already mentioned, the turning device has a predetermined axis of rotation, about which the apparatus is rotatably mounted. Here, the term "axis of rotation" or "rotational axis" denotes an axis, in particular a predetermined axis, about which the turning device can be rotated through an angle, typically through any angle. In particular for the purposes of a unique predetermination of an axis of rotation, the turning device can in this case have a device, attached to an outer side of the turning device and typically in the form of cylindrical or conic rods disposed opposite one another on the outer side, which device, firstly, is introducible into a bearing element provided for receiving the turning device and, secondly, is consequently able to be used as a shaft for the bearing element. On account of the axis of rotation, the turning device can consequently not only secure the lens but also rotate the lens, while the latter is secured, through an angle, typically through any angle. Here, in particular, the turning device can be configured to turn the lens, i.e., rotate the lens through an angle of ±180°. Here, the specified angle of ±180° includes tolerances known to a person skilled in the art, in particular a deviation of 15°, typically of 5°. Typically, this can facilitate processing of the lens, typically coating of the spectacle lens in the vacuum coating installation, on both sides of the lens, typically of the spectacle lens.

In an exemplary embodiment, the turning device can be present in the form of a turning ring. The term "turning ring" denotes a turning device which, when observed in a plan view, adopts the form of a ring with a circular, elliptical, or oval shape, with the form of the turning ring typically being adapted to the lens to be received, in particular to the spectacle lens to be received.

Within the scope of the present disclosure, the term "introducing" or "introduction" denotes, in principle, a damage-free insertion of the lens into the turning device by means of the apparatus. Typically, this is understood to mean that the lens, in particular the spectacle lens, can be received by the holding means of the turning device, secured in the receptacle opening formed thereby, and turned through an angle about the axis of rotation of the turning device in the secured state, when required or according to timing.

The apparatus proposed here comprises a carrier body and a carrier element for receiving the lens. Here, the term "carrier body" denotes in principle any part of the apparatus which, firstly, is configured to receive the carrier element and, secondly, facilitate or at least simplify handling of the apparatus without directly impinging on the carrier element in the process. In an exemplary embodiment, the carrier body may have a cutout to this end, in particular a cutout facing the turning device or the support, described below, for the turning device, the carrier element being introduced into the cutout. As a result of the cutout, the lens can be applied to the carrier element so as to avoid slipping of the lens from the carrier element to the greatest possible extent. However, alternative configurations are possible, for instance a perforation into which the carrier element has been introduced. Moreover, the carrier body can have an outer side, which a handling element can grip and thus undertake the handling of the proposed apparatus.

Here, the term "carrier element" denotes in principle any part of the apparatus which is configured to temporarily receive the lens, particularly until the lens has been introduced into the turning device. For this purpose, the carrier element has a supporting surface. Here, the term "supporting surface" denotes a supporting surface, which is not necessarily planar, configured to receive the lens. Here, the supporting surface has a lateral extent in two dimensions, which is suitable for receiving the lens. Here, the supporting surface can have a round, oval, square, rectangular or hexagonal area. In an exemplary embodiment, the supporting surface can be part of a supporting plate. However, other configuration types of the supporting surface are conceivable. As a result of this configuration of the carrier element, which comprises a supporting surface, a particularly simple and secure type of introduction, storage, movement, and transport of the lens on the carrier element can be achieved. Irrespective of its type of configuration, the supporting surface can typically be configured in such a way that its area only slightly exceeds the area required to support the lens.

In an exemplary embodiment, the supporting surface can be non-planer; instead, the support surface can have a height profile which typically has a height difference greater than 0 mm and up to 10 mm. This can ease the introduction into the turning device of a lens, in particular a spectacle lens, which does not have a round edge but, for example, an oval edge, especially because, as a result of a height adjustment possible hereby, the edge of the relevant spectacle lens can be better received by the holding means, typically the clamping section of the holding body or the spring element, typically the at least one tensioning spring.

In an exemplary embodiment, a distance between an edge of the supporting surface and the carrier body, which distance can be present in the form of a gap, in particular, can be selected to be as small as possible, in particular less than 2 mm, typically less than 1 mm. This can prevent an edge of a lens, especially of a spectacle lens, from slipping into the gap and, acting, as it were, like a wedge, impeding a movement of the supporting plate, as described in more detail below.

In an exemplary embodiment, the carrier body can furthermore have at least one support, which is configured to receive the turning device. Here, the term "support" denotes in principle any part of the proposed apparatus, the relative position and form of which are configured in such a way that the apparatus and the turning device can be secured relative to one another in a set way by means of the support. This can simplify spatial securing of the apparatus in relation to the turning device. Alternatively, the apparatus can be secured in relation to an element surrounding the turning device, for example a segment of a spherical cap of the coating installation.

In principle, the apparatus is suitable for any article for as long as the carrier element is configured to receive the article. In an exemplary embodiment, the apparatus is suitable for an optical lens, particularly typically for a spectacle lens. Within the scope of the present disclosure, an optical lens is understood to mean an optically transparent element comprising two light-refractive surfaces that are disposed opposite one another. Since lenses generally have an optically transparent material, selected in particular from glass, quartz or a transparent organic plastic, gentle treatment of the lens and, in particular, of its surface is particularly advantageous. The "gentle treatment" is to be understood to mean the application of as little force as possible and as little friction as possible on the lens by means of the apparatus, for which the apparatus proposed here is advantageously suitable. Typically, spectacle lenses are suitable for a use of the apparatus, the spectacle lenses having a size from 1 cm to 1 m, typically from 2 cm to 50 cm, in particular depending on a spatial extent of the carrier element.

Within the scope of the present disclosure, a "spectacle lens" is understood to mean an optical lens that, pursuant to DIN EN ISO 13666:2013-10, paragraphs 8.1.1 and 8.1.2, should be used for measuring and/or correcting ametropia and/or for protecting the eye or for changing its appearance, the optical lens being worn in front of the eye but not being in contact with the eye. The spectacle lens may typically have an optically transparent material, selected in particular from glass, quartz or a transparent organic plastic.

Independently of its specific configuration, the lens has a center of gravity. In this case, the term "center of gravity" or "center of mass" denotes an imaginary point within or outside a volume taken up by the lens, which point corresponds to an average of the relative positions of all mass elements of the lens, which are weighted with the respective mass of the relevant mass element. If, like in the case of spectacle lenses, in particular, there is a practically homogeneous mass distribution with substantially the same density within the volume of the spectacle lens, the center of gravity of the spectacle lens corresponds to a geometric centroid, which corresponds to the mean of all volume elements within the volume of the spectacle lens.

According to the present disclosure, the carrier element is intended to be mounted in such a displaceable fashion with respect to the carrier body that the lens is thereby rendered introducible into the turning device. Here, the term "displaceable" denotes a property of an attachment of the carrier element in the carrier body, according to which the carrier element can change its position or relative position in at least one preferred direction, typically in exactly one specific direction, in particular along a predetermined axis, upon the action of a force on the carrier element. As a consequence of the change in the relative position of the carrier element, a lens, typically located on the supporting surface of the supporting plate, received by the carrier element is moved together with the carrier element as a result thereof. Consequently, according to the disclosure, the change in the relative position of the carrier element in relation to the carrier body can be implemented so that the relative position of the carrier element changes in such a way that, as a result thereof, the lens received by the carrier element is moved until the lens is introduced into the turning device as a result of this movement. In the above-described configuration where the carrier element has the spacer plate, a distance between the spacer plate and the turning device, in particular between the supporting surface of the spacer plate and the axis of rotation of the turning device, can have an adjustable configuration in this case. Hence the center of gravity of the lens can very easily be brought in line with the axis of rotation of the turning device.

Consequently, the lens can be displaced in an exemplary embodiment of the present disclosure until the center of gravity of the lens is brought in line with the axis of rotation, about which the turning device is rotatably mounted. In this way, as mentioned at the outset, the lens, in particular the spectacle lens, can be clamped in the turning device in such a way that the center of gravity of the lens finally comes to rest on the axis of rotation of the turning device. What this can facilitate is that the turning procedure of the turning ring can be fully completed, even if the magnetic field that was activated to turn the turning ring was deactivated therebefore. Here, the term "turning procedure" denotes a process during which the turning rings, which are attached to the segments of a spherical cap, are turned. As a rule, the turning rings are not all turned at the same time; instead, they are turned in succession within one layer on a spherical cap collar. The turning procedure of an individual turning ring is implemented when, during a rotation of the spherical cap, the turning ring is guided past a turning device which provides a magnetic field. If the magnetizable turning ring is attracted by the magnetic field in the process, it begins to rotate about the axis of rotation of the turning ring, in particular through an angle of ±180°. However, other configuration types of the turning procedure are possible.

As mentioned above, the carrier body in an exemplary embodiment can have at least one support for receiving the turning device, in particular to spatially secure the apparatus and the turning device in relation to one another in a set manner. It is particularly advantageous in this configuration for the carrier element to further be displaceably mounted in relation to the support. This can advantageously assist the displacement of the center of gravity of the lens to be in line with the axis of rotation, about which the turning device is rotatably mounted.

The carrier element in an exemplary embodiment of the present disclosure can be continuously displaceable, to be precise, firstly, in relation to the carrier body and typically, secondly, also in relation to the support for receiving the turning device. Here, the term "continuous" describes a type of displacement which can adopt in principle any value within an interval that is bounded by a minimum displacement and a maximum displacement. An interval of greater than 0 mm and up to 30 mm, within which the displacement, more particularly the continuous displacement, of the carrier element is possible, can be particularly typical, particularly when introducing spectacle lenses into the turning ring. In particular, the continuous displacement is advantageous in that the introduction of the center of gravity of the lens in line with the axis of rotation, about which the turning device is rotatably mounted, can be implemented in a particularly simple and accurate manner. In an alternative but less typical configuration, the carrier element can be incrementally displaceable, i.e., displaceable in small steps.

In order to be able to undertake the displacement, in particular the continuous displacement, of the carrier element, provision can be made for a displacement device, which is configured to mount the carrier element in displaceable fashion in relation to the carrier body. Here, in principle, the term "displacement device" denotes any device that is configured so as to be able to carry out the displacement, in particular the continuous displacement, of the carrier element. Typically, this can be a mechanical device, in particular selected from a spring device, a screwing device, and a hydraulic device. However, other types of displacement devices are possible. In an exemplary embodiment, the displacement of the supporting plate can be achieved here by spring-mounting the supporting plate on compression springs. Here, the term "spring mounting" describes mounting the carrier element on an elastic element that can exert such a force on the carrier element that a displacement of the carrier element can be brought about thereby. Alternatively, any other type of suspension can be used in place of mechanical suspension, in particular a suspension by means of an elastic material, typically using a foam, a rubber, or an air balloon. However, other types of suspension are possible. Here, the term "screwing device" denotes a device that can bring about a displacement of the carrier element by way of a force on the carrier element that is caused by means of a rotation of the device. The term "hydraulic device" relates to a device that can bring about a displacement of the carrier element by using a liquid, in particular water, an aqueous solution, or oil, for generating a force on the carrier element. Independently of its configuration, the displacement device can have, in particular, the advantage of this allowing a simple and determinable displacement of the lens.

The fact that the relative position of the center of gravity of the lens, in particular of the spectacle lens, can correlate sufficiently well with its form and weight can advantageously be exploited when displacing the carrier element. This can especially have a positive effect on the spring device, in particular the compression spring, which, by means of its spring force, can counter the weight exerted by the carrier element and the lens located thereon and which can thus bring about an equilibrium.

However, especially in view of the geometric form of the spectacle lenses, a distinction will have to be made as to whether this relates to a spectacle lens with positive optical power, which is also referred to as a "positive lens," or a spectacle lens with negative optical power, which is also referred to as "negative lens." Here, there can be a difference, in particular, in the thickness of the lens edge, which is thick in the case of negative lenses and thin in the case of positive lenses, and in the thickness at the lens center, which is thin in the case of negative lenses and thick in the case of positive lenses. Depending on the optical effect of the spectacle lens, this may lead to a different type of correlation between the action of force on the carrier element and the displacement of the carrier element caused thereby; however, a person skilled in the art can easily take account of this. Consequently, when introducing the spectacle lenses into the turning ring, using the present apparatus, many relative positions of centers of gravity of different spectacle lenses can be matched to the relative position of the axis of rotation of the turning ring by way of the adjustable carrier element, which is displaceable, typically continuously displaceable, in terms of its height.

In a further exemplary embodiment, the apparatus can furthermore have at least one guiding device for guiding the carrier element. Here, in principle, the term "guiding device" denotes any device that provides mechanical support for the carrier element during the displacement of the carrier element. Here, the guiding device can have typically at least one cylindrical or conical guiding rod, typically a plurality of cylindrical or conical guiding rods, which, guided in a shaft provided therefor, can engage in the carrier element. However, other configurations of the guiding device are possible. The guiding device can be used to facilitate a displacement of the carrier element in a desired direction, in particular in the direction of the axis of rotation of the turning device, without tilting the carrier element, in particular to prevent slippage of the lens from the carrier element, more particularly from the supporting surface.

In an exemplary embodiment, the displacement device, typically the spring device, in particular the at least one compression spring, and/or the guiding device, in particular the at least one guide rod, can be disposed in the vicinity of an edge of the carrier element, in particular of the supporting plate, especially in order to obtain a relative position of the carrier element, in particular of the support plate, which is as stable as possible. In this configuration, the center of a mid-perpendicular of the spring device and/or of the guiding rod can be attached at a distance from the edge that is less than one quarter of a mean extent of the carrier element, in particular of a diameter of the supporting plate. However, other ways of attaching the displacement device and/or the guiding device are possible.

In a further exemplary embodiment, the supporting surface can be configured for the lens, in particular for the spectacle lens, and/or the support can be configured for the turning device, in particular for the turning ring, with little dynamic friction, especially so that the lens and/or the turning device can be moved as easily as possible during clamping. Furthermore, surfaces of the displacement device, typically of the spring device, in particular the at least one compression spring, and/or of the guiding device, in particular of the at least one guiding rod, can have a low-friction embodiment, especially so that the displacement device and/or the guiding device are movable as easily as possible. Here, the term "low-friction" in each case denotes a coefficient of dynamic friction, pursuant to DIN 53375, of 0.02 to 0.5.

In an exemplary embodiment, the carrier element, in particular the supporting plate, can have studs which can be used to spread the tensioning springs, which can be used as a holding means in the turning device. Typically, the turning ring can be rotated clockwise for the purposes of spreading the tensioning springs. Here, these studs can be configured as part of the carrier body or can be placed on the carrier body as a separate part. Here, the studs can be located opposite the ends of a star component, which is configured as part of the carrier element or which is placeable on the carrier element as a separate part. In this exemplary embodiment, a lateral dimension of the studs can be at least as large as the greatest lateral extent of a spring part of the tensioning springs, which is not guided along the stud when spreading the tensioning springs. In this way, each of the tensioning springs can be far enough away from the carrier element, in particular from the supporting plate, even if the end of the tensioning spring is bent inward, so that the carrier element, in particular the supporting plate, can move without impediment where possible.

In a further aspect, the present disclosure relates to a method for introducing an optical lens into a turning device. The method comprises the following steps, typically in the stated sequence. Another sequence is also possible in principle. In particular, the method steps could also be performed entirely or partially at the same time. It is furthermore possible for individual, multiple or all steps of the method to be performed repeatedly, in particular more than once. In addition to the stated method steps, the method may also comprise further method steps.

The method steps of the method for introducing an optical lens into a turning device are as follows:
a) providing an apparatus for introducing an optical lens into a turning device, wherein the apparatus comprises a carrier body and a carrier element for receiving the lens, wherein the carrier body is configured to receive the carrier element and wherein the carrier element has a supporting surface for receiving the lens;
b) applying the lens on the carrier element; and
c) introducing the lens into the turning device from the carrier element,
wherein the carrier element is displaced in relation to the carrier body in such a way that the lens is introduced into the turning device as a result thereof.

The provision of the apparatus for introducing a lens into a turning device in an initial state in method step a) involves, in particular, the apparatus that has been described in more detail elsewhere in this document. Accordingly, for definitions and optional configurations, reference may substantially be made to the description of the apparatus.

According to method step b), there is an application of a lens to be handled onto the carrier element. As described above, this can typically be an optical element, particularly typically a spectacle lens. Here, the lens to be handled can be applied manually, but typically by means of an automatic handling device, for example by means of a robot.

According to method step c), the lens is introduced into the turning device from the carrier element in accordance with the disclosure, according to which the carrier element is displaced in relation to the carrier body in such a way that the lens is introduced into the turning device as a result thereof.

In an exemplary embodiment, the center of gravity of the lens in this case is brought in line with an axis of rotation, about which the turning device is rotatably mounted. The term "bringing the center of gravity of the lens in line with an axis of rotation" here comprises both bringing the center of gravity of the lens exactly in line with the axis of rotation about which the turning device is rotatably mounted and bringing the center of gravity of the lens in line with another axis of rotation, the latter however only slightly deviating from the specified axis of rotation, in particular by no more than 2 mm, typically by no more than 1 mm, and particularly typically by no more than 0.5 mm.

In a further exemplary embodiment, in which the carrier body has at least one support for the turning device, the turning device is placed on the at least one support and the carrier element is also displaced in relation to the support.

In a further aspect, the present disclosure relates to a method for producing at least one spectacle lens. The method comprises handling the spectacle lens at least during the production of the spectacle lens by means of the proposed apparatus and/or by means of a method for introducing an optical lens into a turning device, as described in more detail elsewhere in this document. Accordingly, reference is largely made to the description of the apparatus and of the method for introducing the optical lens into a turning device in respect of definitions and optional configurations.

For further details in relation to the present methods, reference is made to the rest of the description relating to the apparatus.

The apparatus according to the disclosure and the present methods have numerous advantages over conventional apparatuses and methods which comprise a rigid carrier element. In particular, the spring-mounting of the carrier element described in this document allows the supporting plate to be displaced downward just so far when placing a spectacle lens that the relative position of the center of gravity of the spectacle lines is as accurately as possible level with the axis of rotation of the associated turning ring, into which the spectacle lens should be inserted. This can especially minimize an application of force for turning the turning ring with a clamped spectacle lens. Further, this can also allow full completion of a full turning procedure of the turning ring with a clamped spectacle lens, which corresponds to a rotation of the spectacle lens through ±180°, even if the magnetic field used to carry out the turning procedure is deactivated before the turning procedure has been completed provided that the turning ring has already rotated through more than 90°. Moreover, this can simplify clamping spectacle lenses with very thick edges into the turning ring, especially since the height of the supporting surface in relation to the axis of rotation of the turning ring need not be adapted by manual setting, for example by removing a star component like in a conventional apparatus.

In summary, within the scope of the present disclosure, the exemplary embodiments of the following clauses are particularly typical:

Clause 1. An apparatus for introducing an optical lens into a turning device, wherein the apparatus comprises a carrier body and a carrier element for receiving the lens, wherein the carrier body is configured to receive the carrier element, wherein the carrier element has a supporting surface for receiving the lens and is displaceably mounted in relation to the carrier body.

Clause 2. The apparatus according to the preceding clause, wherein the supporting surface is displaceably mounted in relation to the carrier body for the purpose of receiving the lens.

Clause 3. The apparatus according to either of the preceding clauses, wherein the carrier element is displaceably mounted in relation to the carrier body in such a way that the lens is introducible into the turning device.

Clause 4. The apparatus according to any one of the preceding clauses, wherein the lens has a center of gravity, wherein the center of gravity of the lens is able to be brought in line with an axis of rotation about which the turning device is rotatably mounted.

Clause 5. The apparatus according to any one of the preceding clauses, wherein the carrier body furthermore has at least one support for the turning device.

Clause 6. The apparatus according to the preceding clause, wherein the carrier element further is displaceably mounted in relation to the support.

Clause 7. The apparatus according to any one of the preceding clauses, wherein the carrier element is continuously displaceable.

Clause 8. The apparatus according to the preceding clause, wherein the carrier element is continuously displaceable in relation to the carrier body and/or in relation to the support.

Clause 9. The apparatus according to any one of the preceding clauses, wherein the carrier element is incrementally displaceable.

Clause 10. The apparatus according to the preceding clause, wherein the carrier element is incrementally displaceable in relation to the carrier body and/or in relation to the support.

Clause 11. The apparatus according to any one of the preceding clauses, wherein the carrier element is displaceable within an interval of greater than 0 mm and up to 30 mm.

Clause 12. The apparatus according to any one of the preceding clauses, wherein the carrier element is introduced into a cutout or into a perforation of the carrier body.

Clause 13. The apparatus according to any one of the preceding clauses, wherein the supporting surface is introduced into a supporting plate for the purpose of receiving the lens, wherein the supporting plate.

Clause 14. The apparatus according to any one of the preceding clauses, wherein the supporting surface is plane.

Clause 15. The apparatus according to either of the two preceding clauses, wherein the supporting surface is selected from a round, oval, square, rectangular and hexagonal supporting surface.

Clause 16. The apparatus according to the preceding clause, wherein the round supporting surface has a diameter.

Clause 17. The apparatus according to any one of the four preceding clauses, wherein the supporting surface has a profile, in particular a height profile.

Clause 18. The apparatus according to the preceding clause, wherein the height profile has a height difference of more than 0 mm and up to 10 mm.

Clause 19. The apparatus according to any one of the four preceding clauses, wherein the distance between the supporting surface and the turning device is adjustable.

Clause 20. The apparatus according to any one of the seven preceding clauses, wherein there is a distance in the form of a gap between an edge of the supporting surface and the carrier body Clause 21. The apparatus according to the preceding clause, wherein the gap is less than 2 mm, typically less than 1 mm.

Clause 22. The apparatus according to any one of the nine preceding clauses, wherein the carrier body has studs that are able to be used for spreading tensioning springs that are used as the holding means in the turning device.

Clause 23. The apparatus according to the preceding clause, wherein the studs are located opposite the ends of a star component, which is configured as part of the carrier element or which is placeable on the carrier element as a separate part.

Clause 24. The apparatus according to either of the two preceding clauses, wherein the turning device is rotatable in the clockwise direction for the purpose of spreading the tensioning springs.

Clause 25. The apparatus according to any one of the three preceding clauses, wherein a lateral dimension of the studs is at least as large as the greatest lateral extent of a spring part of the tensioning springs, which is not guided along the stud when spreading the tensioning springs.

Clause 26. The apparatus according to any one of the preceding clauses, wherein provision is furthermore made of a displacement device for displacing the carrier element in relation to the carrier body.

Clause 27. The apparatus according to the preceding clause, wherein the displacement device is selected from a spring device, a hydraulic device and a screwing device.

Clause 28. The apparatus according to the preceding clause, wherein the spring device comprises at least one compression spring, typically a plurality of compression springs.

Clause 29. The apparatus according to the preceding clause, wherein the at least one compression spring is introduced in a spring shaft.

Clause 30. The apparatus according to any one of the four preceding clauses, wherein at least one surface of the displacement device has a low-friction clause.

Clause 31. The apparatus according to the preceding clause, wherein the at least one surface of the displacement device has a coefficient of dynamic friction, pursuant to DIN 53375, of 0.02 to 0.5.

Clause 32. The apparatus according to any one of the six preceding clauses, wherein the center point of a mid-perpendicular of the displacement device, typically of the spring device, in particular of the at least one compression spring, is attached at a distance from the edge of less than one quarter of a mean extent of the carrier element, in particular of the diameter of the support plate.

Clause 33. The apparatus according to any one of the preceding clauses, wherein provision is furthermore made of at least one guiding device for guiding the carrier element when displacing the carrier element.

Clause 34. The apparatus according to the preceding clause, wherein the spring device comprises at least one guiding rod, typically a plurality of guiding rods.

Clause 35. The apparatus according to the preceding clause, wherein the at least one guiding rod is guidable in a guiding shaft in such a way that the at least one guiding rod engages in the carrier element.

Clause 36. The apparatus according to any one of the four preceding clauses, wherein at least one surface of the guiding device is a low-friction surface.

Clause 37. The apparatus according to the preceding clause, wherein the at least one surface of the guiding device has a coefficient of dynamic friction, pursuant to DIN 53375, of 0.02 to 0.5.

Clause 38. The apparatus according to any one of the six preceding clauses, wherein the center point of a mid-perpendicular of the guiding device, in particular of the at least one guiding rod, is attached at a distance from the edge of less than one quarter of a mean extent of the carrier element, in particular of the diameter of the support plate.

Clause 39. A method for introducing an optical lens into a turning device, including the steps of:
a) providing an apparatus for introducing an optical lens into a turning device, wherein the apparatus comprises a carrier body and a carrier element for receiving the lens, wherein the carrier body is configured to receive the carrier element and wherein the carrier element has a supporting surface for receiving the lens;
b) applying the lens on the carrier element; and
c) introducing the lens into the turning device from the carrier element,
wherein the carrier element is displaced in relation to the carrier body in such a way that the lens is introduced into the turning device.

Clause 40. The method according to the preceding clause, wherein the lens has a center of gravity, wherein the center of gravity of the lens is brought in line with an axis of rotation about which the turning device is rotatably mounted.

Clause 41. The method according to either of the two preceding clauses, wherein the carrier body has at least one support for the turning device, wherein the turning device is placed on the at least one support and the carrier element is displaced in relation to the support.

Clause 42. The method according to any one of the three preceding clauses, wherein a spectacle lens is provided and introduced into a turning ring.

Clause 43. A method for producing at least one spectacle lens, wherein the spectacle lens is handled, at least during the production of the spectacle lens, by means of an apparatus for introducing the optical lens into a turning device, wherein the apparatus comprises a carrier body and a carrier element for receiving the lens, wherein the carrier body receives the carrier element and wherein the carrier element has a supporting surface for receiving the lens and wherein the carrier element is displaced in relation to the carrier body in such a way that the lens is introduced into the turning device.

Clause 44. The method according to the preceding clause, wherein the spectacle lens is turned by means of the turning device between a coating of a first side of the spectacle lens and the coating of a second side of the spectacle lens.

Further details and features of the disclosure will become apparent from the following description of exemplary embodiments, in particular in conjunction with the dependent claims. In this case, the respective features can be realized by themselves or as a plurality in combination with one another. The disclosure is not restricted to the exemplary embodiments. The exemplary embodiments are illustrated schematically in the drawings. In this case, identical reference numerals in the individual drawings designate identical or functionally identical elements or elements corresponding to one another with regard to their functions.

DESCRIPTION OF EXEMPLARY EMBODIMENTS

Figure 1A:
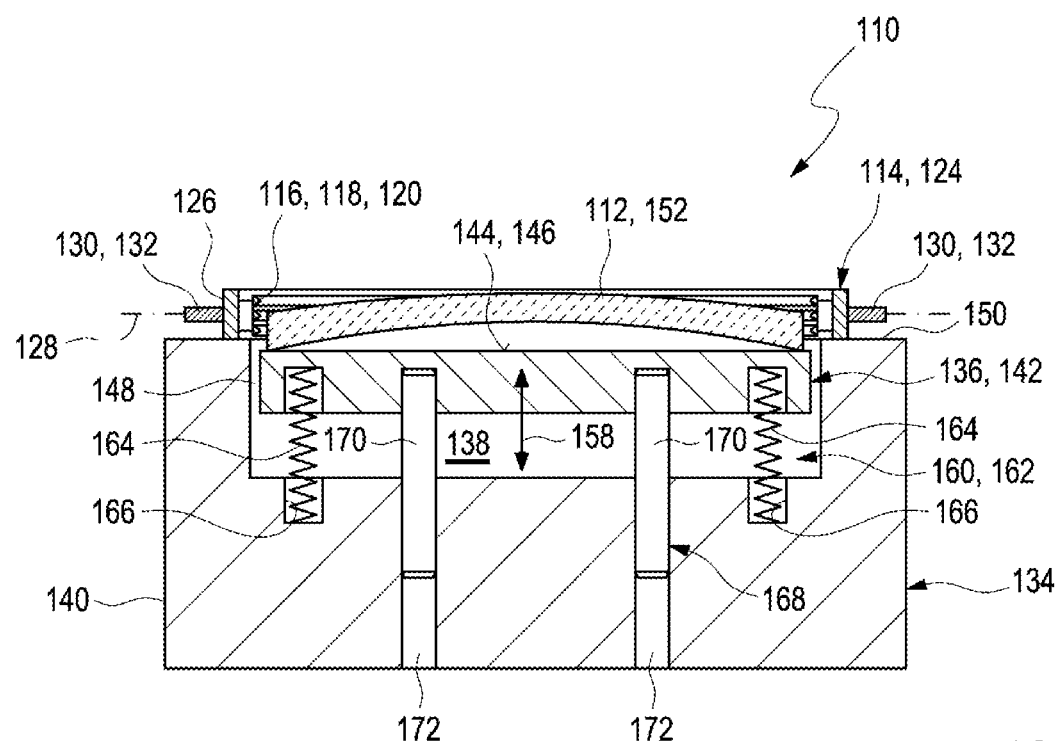
FIG. 1A shows a cross-sectional illustration of an exemplary embodiment of an apparatus for introducing an optical lens into a turning device.
Figure 1B:
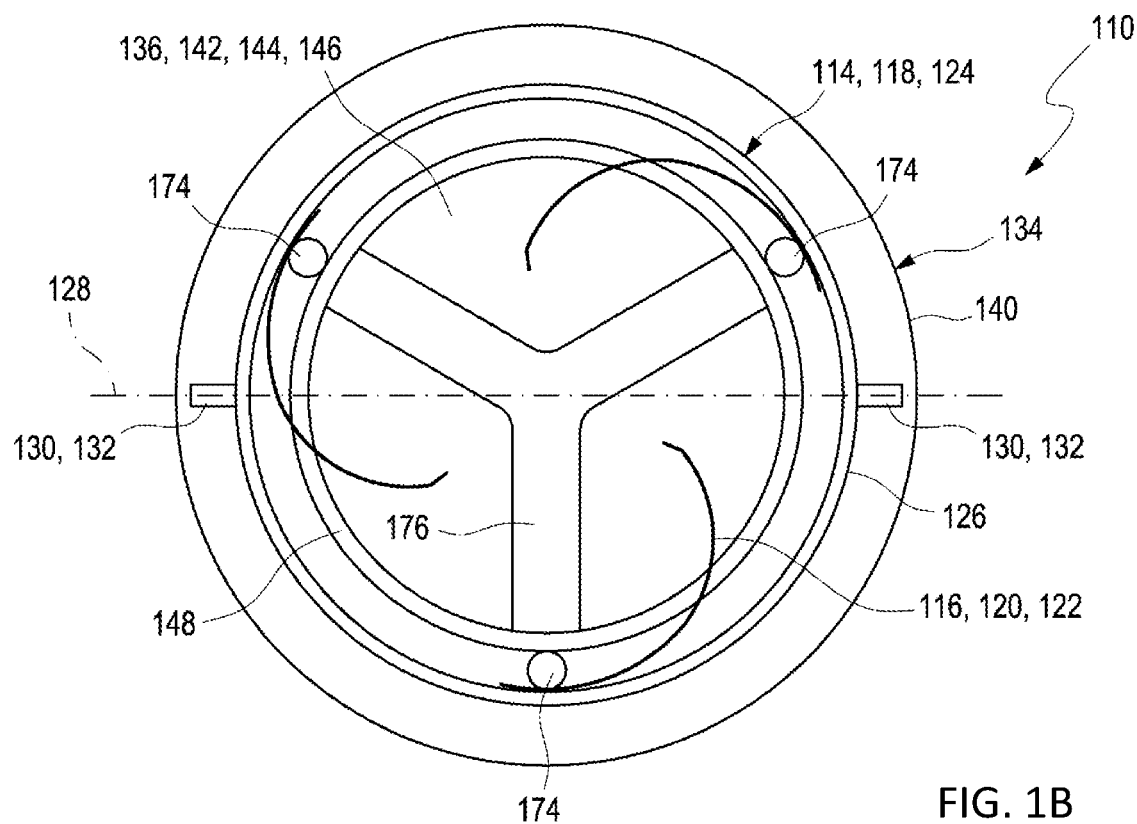
FIG. 1B shows a top view of an exemplary embodiment of an apparatus for introducing an optical lens into a turning device.

FIGS. 1A and 1B shows a schematic illustration of a typical exemplary embodiment of an apparatus 110 for introducing an optical lens 112 into a turning device 114, in a cross section (FIG. 1A) and in a plan view (FIG. 1B). Here, the apparatus 110 can facilitate, in particular, a damage-free introduction of the lens 112 into the turning device 114.

The turning device 114, which is configured to temporarily or permanently receive the lens 112, can have at least one holder 116 to this end, the lens 112 being able to be secured in the holder during a period of time. To this end, the holder 116 can have a frame 118 and at least one holding means 120 attached to or introduced in the frame. Here, the holding means 120 can be formed, for example, from a clamping section of a holding body (not illustrated) like in DE 101 46 542 A1 or EP 1 295 962 A1 or, as illustrated in FIG. 1B, it can be embodied as a spring element in the form of tensioning springs 122. However, other types of holding means 120 are possible.

The embodiment of the turning device 114 schematically illustrated in FIGS. 1A and 1B is present in the form of a turning ring 124, wherein, in addition to the holder 116 for receiving the lens 112, the turning ring 124 comprises a device 130, which is attached to an outer side 126 of the turning ring 124 and provided for setting an axis of rotation 128. As a result of this, the turning ring 124 can be moved through any angle about the axis of rotation 128. The device 130 attached to the outer side 126 of the turning ring 124 has cylindrical rods 132, which are disposed opposite one another on the outside 126 of the turning ring 124. Firstly, the rods 132 are insertable into a bearing element (not illustrated) provided for receiving these and, secondly, the rods thus serve as a shaft for the bearing element. Hence, the turning ring 124 can not only secure the lens 112 but simultaneously also turn it in the secured state through an angle, in particular in order to thus facilitate the processing of the lens 112, typically a coating of the lens 112 in a vacuum coating installation, from both sides. Therefore, the turning ring 124 can typically be configured for rotating the lens 112 through an angle of ±180°, taking account of tolerances known to a person skilled in the art, in particular taking account of a deviation of 15°, typically 5°.

The apparatus 110 schematically illustrated in FIGS. 1A and 1B comprises a carrier body 134 and a carrier element 136 for receiving the lens 112, wherein the carrier body 134 is configured firstly to receive the carrier element 136 and secondly to facilitate or at least simplify the handling of the apparatus 110, without the carrier element 136 being directly impinged on in the process. The carrier body 134 illustrated schematically in FIGS. 1A and 1B has a cutout 138, in which the carrier element 136 is introduced. Alternatively, the carrier body 134 can have a perforation (not illustrated), in which the carrier element 136 is introduced. Further, the carrier body 134 can have an outer side 140, which a handling element can grip and thus undertake the handling of the apparatus 110.

The embodiment of the carrier element 136 illustrated schematically in FIGS. 1A and 1B comprises a supporting plate 142, which has a supporting surface 144 configured to receive the lens 112. As shown in FIGS. 1A and 1B, the supporting surface 144 can typically be embodied as a round supporting surface 146; however, a different embodiment of the supporting surface 144 is possible, for example an oval, square, rectangular or hexagonal supporting surface. In an exemplary embodiment (not illustrated), the supporting surface 144 can have a non-planer configuration; instead, it can have a height profile which typically has a height difference of greater than a 0 mm and up to 10 mm. In a particularly typical exemplary embodiment, a distance between an edge of the supporting surface 144 and the carrier body 134 can be present in the form of a gap 148 and can be selected to be as small as possible in this case, in particular less than 2 mm, typically less than 1 mm. This can prevent an edge of the lens 112 from slipping into the gap 148 and, acting, as it were, like a wedge, impeding a movement of the supporting plate 142 there.

The exemplary embodiment of the carrier body 134 schematically illustrated in FIGS. 1A and 1B further has a support 150, which is configured to receive the turning ring 124. To this end, the relative position and form of the support 150 are embodied in such a way that the apparatus 110 and the turning ring 124 can be secured with respect to one another in a set way by means of the support 150. This can simplify spatial securing of the apparatus 110 in relation to the turning ring 124. However, other types of securing are possible.

The apparatus 110 schematically illustrated in FIGS. 1A and 1B is suitable for any lens 112 for as long as the carrier element 136 is configured to receive the lens 112. Depending on a spatial extent of the carrier element 136, the lens 112 can consequently have a size from 1 cm to 1 m, typically from 2 cm to 50 cm. Typically, the apparatus 110 can be used for an optical element, particularly typically a spectacle lens 152. To this end, the spectacle lens 152 can typically be configured as a refractive optical lens or lens system, and can typically have an optically transparent material, in particular selected from glass, quartz and a transparent organic plastic.

Figure 2:
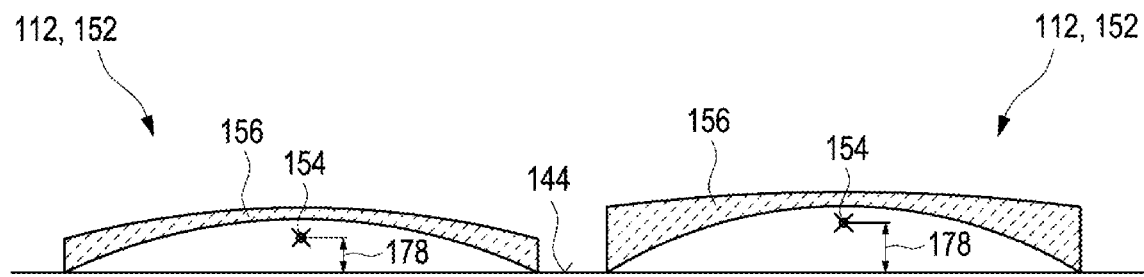
FIG. 2 shows a cross-sectional illustration of typical articles and their associated centers of gravity.

As FIG. 2 schematically illustrates, the lens 112, in particular the spectacle lens 152, has a center of gravity 154. In this case, the center of gravity 154 denotes an imaginary point within or outside a volume 156, which is taken up by the spectacle lens 152 and corresponds to an average of the relative positions of all mass elements of the lens 112, which are weighted with the respective mass of the relevant mass element. If, like in the case of optical elements, in particular spectacle lenses 152, there is a practically homogeneous mass distribution with substantially the same density within the volume 156 of the spectacle lens 152, the center of gravity 154 of the spectacle lens 152 corresponds to a geometric centroid, which corresponds to the mean of all volume elements within the volume 156 of the spectacle lens 152.

According to the disclosure, the carrier element 136 schematically illustrated in FIGS. 1A and 1B is displaceably mounted in relation to the carrier body 134 in such a way that the lens 112 is introducible into the turning ring 124 as a result thereof. The possibility of a displaceability of the carrier element 136 in relation to the carrier body 134 causes the carrier element 136 to be able to change its position or relative position in one direction 158 upon the action of a force on the carrier element 136. A consequence of the change in the relative position of the carrier element 136 is that the lens 112 received by the carrier element 136 is moved together with the carrier element 136. Consequently, the change in the relative position of the carrier element 136 in relation to the carrier body 134 can be implemented so that the relative position of the carrier element 136 changes in such a way that, as a result thereof, the lens 112 received by the carrier element 136, in particular on the supporting surface 144 of the supporting plate 142, is moved until the lens is introduced into the turning ring 124 as a result of this movement. Here, a distance between the supporting plate 142 and the turning ring 124, in particular a distance between the supporting surface 144 of the supporting plate 142 and the axis of rotation 128 of the turning ring 124, can be configured to be adjustable.

Consequently, in a particularly typical exemplary embodiment, the spectacle lens 152 can be displaced until the center of gravity 154 of the spectacle lens 152 is brought in line with the axis of rotation 128, about which the turning ring 124 is rotatably mounted. Hence, the spectacle lens 152 can be clamped into a turning ring 124 in such a way that the center of gravity 154 of the spectacle lens 152 finally comes to rest on the axis of rotation 128 of the turning ring 124. As described above, what this can facilitate is that a turning procedure of the turning ring 124 can be fully completed, even if a magnetic field that was activated to turn the turning ring 124 was deactivated therebefore. The turning ring 124, which is applied to segments of a spherical cap of the vacuum coating installation, can be turned during the turning procedure. As a rule, not all of the turning rings 124 situated on the spherical cap of the vacuum coating installation are turned simultaneously in the process; instead, they are rotated successively within a spherical cap collar. The turning procedure is implemented once the turning ring 124 is guided past the magnetic field during a rotation of the spherical cap. If the magnetizable turning ring 124 is attracted by the magnetic field in the process, it begins to rotate about the axis of rotation of the turning ring, in particular through an angle of ±180°. However, other configuration types of the turning procedure are possible.

In the exemplary embodiment of the carrier body 136 illustrated in FIGS. 1A and 1B, the carrier element is furthermore mounted so as to be displaceable in relation to the support 150. This can advantageously assist the displacement of the center of gravity 154 of the spectacle lens 152 in line with the axis of rotation 128, about which the turning ring 124 is rotatably mounted.

It is particularly typical for the carrier element 136 to be continuously displaceable, to be precise in relation to the carrier body 134 and/or, typically, in relation to the support 150. As a result, the displacement can assume any value within an interval that is bounded by a minimum displacement and a maximum displacement. An interval of greater than 0 mm and up to 30 mm, within which the displacement, more particularly the continuous displacement, of the carrier element 136 is possible, can be particularly typical, specifically when introducing spectacle lenses 152 into the turning ring 124. In an alternative but less typical configuration, the carrier element 136 can be incrementally displaceable, i.e., displaceable in small steps.

The displacement, in particular the continuous displacement, of the carrier element 136 is implemented by means of a displacement device 160, which is configured to mount the carrier element 136 in displaceable fashion in relation to the carrier body 134. The exemplary embodiment of the displacement device 160 schematically illustrated in FIGS. 1A and 1B comprises a mechanical device in the form of a spring device 162, which has at least one compression spring 164 that is introduced in a dedicated spring shaft 166. As shown in FIG. 1A, the displacement of the supporting plate 142 can be facilitated here by spring-mounting the supporting plate 142 on the compression springs 164. Alternatively, any other type of suspension (not illustrated) can be used in place of a mechanical suspension, in particular a suspension by means of an elastic material, typically using a foam, a rubber or an air balloon. However, other types of displacement devices are conceivable, in particular a screwing device or hydraulic device (not illustrated).

What can advantageously be exploited when the carrier element 136 is displaced as proposed is that the relative position of the center of gravity 154 of the spectacle lens 152 can correlate sufficiently well with the form and the weight of the spectacle lens 152. As already mentioned, the present apparatus 110 can consequently achieve matching of various relative center of gravity positions of different spectacle lenses 152 with the relative position of the axis of rotation 128 of the turning ring 124 by way of the height-adjustable, typically continuously height-adjustable, carrier element 136 when the spectacle lenses 152 are introduced into the turning ring 124.

The exemplary embodiment of the apparatus 110 schematically illustrated in FIGS. 1A and 1B can further have at least one guiding device 168 for guiding the carrier element 136. As shown in FIG. 1A, the guiding device 168 may comprise a plurality of cylindrical guiding rods 170 in this case, which guiding rods are guidable in a dedicated guiding shaft 172 in such a way that they can engage in the carrier element 136. This can facilitate a displacement of the carrier element 136 in the desired direction 158 without tilting the carrier element 136, especially to prevent the lens 112 from slipping from the supporting surface 144 of the supporting plate 142.

In a particularly typical exemplary embodiment, the at least one compression spring 164 and/or the at least one guiding rod 170 can be disposed in the vicinity of an edge of the supporting plate 142, especially in order thus to achieve a relative position of the carrier element 136 that is as stable as possible. Here, the center point of a mid-perpendicular of the compression spring 164 and/or of the guiding rod 170 can be attached at a distance from the edge of less than one quarter of the diameter of the supporting plate 142. However, a different configuration is possible.

Typically, the supporting surface 144 for the lens 112, in particular for the spectacle lens 152, and/or the support 150 for the turning ring 124 can have an embodiment with little dynamic friction. As a result, the lens 112 and/or the turning ring 124 can be easily moved during the clamping process. Furthermore, the surfaces of the spring shafts 166 and/or of the guiding shafts 172 of the at least one compression spring 164 and the at least one guiding rod 170, respectively, can also have such an embodiment that the at least one compression spring 164 and/or the at least one guiding rod 170 can be moved as easily as possible. As already mentioned, a coefficient of dynamic friction, pursuant to DIN 53375, of 0.02 to 0.5 is particularly typical.

In a particular exemplary embodiment, the carrier body 134, in particular the support 150, can have studs 174 which can be used to spread the tensioning springs 122. Typically, the turning ring 124 can be rotated clockwise for the purpose of spreading the tensioning springs 122. Here, these studs 174 can be located opposite the ends of a star component 176, which can be embodied as part of the supporting plate 142 or, typically, which can be placed onto the supporting plate 142 as a separate part. Here, a lateral dimension of the studs 174 can be at least as large as the greatest lateral extent of a spring part of the tensioning springs 122, which is not guided along the stud 174 when spreading the tensioning springs 122. In this way, each of the tensioning springs 122, even if their end is bent inward, can be far enough away from the supporting plate 142 so that the supporting plate 142 can move without impediment where possible.

As already mentioned, the relative position of the center of gravity 154 of the spectacle lens 152 when placed on the supporting plate 142 is determined by its form. On account of numerous different forms of the spectacle lenses 152, the centers of gravity 154 thereof have a correspondingly different distance 178 from the supporting surface 144, as is evident from FIG. 2. Setting up a variable height for the supporting surface 144, as proposed here, therefore solves the problem of the present disclosure of bringing the center of gravity 154 of the spectacle lens 152 in line with the axis of rotation 128 of the turning ring 124 and, as a result of this, differs from apparatuses known from the related art, which have a rigid supporting surface.

Figure 3:
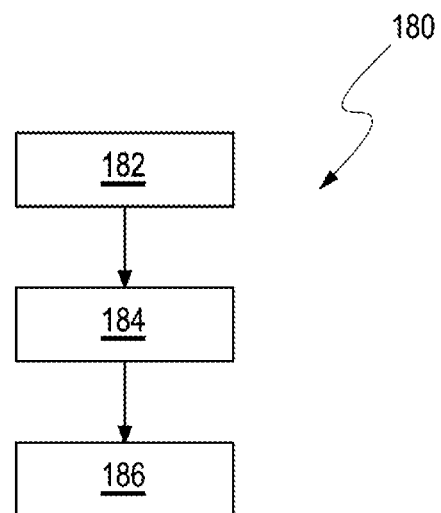
FIG. 3 shows a flowchart of an exemplary embodiment of a method for introducing an optical lens into a turning device.

FIG. 3 schematically shows a flowchart 180 of a typical exemplary embodiment of a method for introducing the optical lens 112 into the turning device 114. According to a provision step 182, the apparatus 110 for introducing the lens 112 into the turning device 114 is provided in an initial step. According to an application step 184, the lens 112 to be handled is applied to the carrier element 136. As described above, the lens 112 particularly typically is a spectacle lens 152. Typically, the application step 184 can be carried out by means of an automatic handling device, for example by means of a robot. According to an introduction step 186, the lens 112 is introduced into the turning device 114 from the carrier element 136 in such a way that, in the process, the carrier element 136 is displaced in relation to the carrier body 134 in such a way that the lens 112 is introduced into the turning device 114 as a result thereof In the particularly preferred configuration according to FIGS. 1A and 1B, the turning device 114 is placed on the at least one support 150 and the carrier element 136 is additionally also displaced in relation to the support 150. Here, it is particularly preferred for the carrier element 136 to be displaced in relation to the carrier body 134 until the center of gravity 154 of the spectacle lens 152 is finally brought in line with the axis of rotation 128, about which the turning device 114 is rotatably mounted.

The method steps presented herein can typically be used in a method for producing at least one spectacle lens 152. This method comprises handling of the spectacle lens 152, at least during the production of the spectacle lens 152 by means of the apparatus 110 and/or during the method for introducing the lens 112 into the turning device 114.

All publications, patents and patent applications cited in this specification are herein incorporated by reference, and for any and all purposes, as if each individual publication, patent or patent application were specifically and individually indicated to be incorporated by reference. In the case of inconsistencies, the present disclosure will prevail.

LIST OF REFERENCE SIGNS 110 apparatus
112 (optical) lens
114 turning device
116 holder
118 frame
120 holding means
122 tensioning spring
124 turning ring
126 outer side of the turning ring
128 axis of rotation
130 device
132 rod 134 carrier body
136 carrier element
138 cutout
140 outer side of the carrier body
142 supporting plate
144 supporting surface
146 round supporting surface
148 gap
150 support
152 spectacle lens
154 center of gravity
156 volume
158 direction
160 displacement device
162 spring device
164 compression spring
166 spring shaft
168 guiding device
170 guiding rod
172 guiding shaft
174 stud
176 star component
178 distance
180 flowchart
182 provision step
184 application step
186 introduction step

The invention claimed is:

1. A method for introducing an optical lens into a turning device, the method comprising:
   providing a turning device and an apparatus, the apparatus being spatially fixed in relation to the turning device and being configured to introduce an optical lens having a convex surface and a concave surface into the turning device,
   wherein the optical lens has a center of gravity, wherein the apparatus includes a carrier body and a carrier element, wherein the carrier body is configured to receive the carrier element, wherein the carrier element has a supporting surface configured to receive the optical lens, wherein the carrier body has at least one support for the turning device, wherein the carrier element has a supporting surface configured to receive the optical lens, and wherein the carrier body has at least one support for the turning device;
   arranging the optical lens on the carrier element;
   introducing the optical lens into the turning device from the carrier element by displacing the carrier element in relation to the carrier body, wherein the turning device is placed on the at least one support and the carrier element is displaced in relation to the support;
   setting a position of the center of gravity of the optical lens relative to an axis of rotation about which the turning device is rotatably mounted; and
   bringing the center of gravity of the optical lens in line with the axis of rotation by repositioning the optical lens in a direction perpendicular to the axis of rotation.

2. The method as claimed in claim 1, wherein the turning device is a turning ring.

3. The method as claimed in claim 1, wherein the optical lens is a spectacle lens, and wherein handling of the spectacle lens is implemented by the apparatus configured to introduce the optical lens into the turning device.

4. The method as claimed in claim 1, wherein the optical lens is a spectacle lens, the method further comprising:
   coating a first side of the spectacle lens;
   turning the spectacle lens having the coating on the first side with the turning device; and
   coating a second side of the spectacle lens.

5. A method for introducing an optical lens into a turning device, the method comprising:
   providing a turning device and an apparatus, the apparatus being spatially fixed in relation to the turning device and being configured to introduce an optical lens having a convex surface and a concave surface into the turning device,
   wherein the optical lens has a center of gravity, wherein the apparatus includes a carrier body and a carrier element, wherein the carrier body is configured to receive the carrier element, wherein the carrier element has a supporting surface configured to receive the optical lens, wherein the carrier body has at least one support for the turning device, wherein the carrier element has a supporting surface configured to receive the optical lens, and wherein the carrier body has at least one support for the turning device;
   arranging the optical lens on the carrier element;
   introducing the optical lens into the turning device from the carrier element by displacing the carrier element in relation to the carrier body, wherein the turning device is placed on the at least one support and the carrier element is displaced in relation to the support;
   setting a position of the center of gravity of the optical lens relative to an axis of rotation about which the turning device is rotatably mounted; and
   bringing the center of gravity of the optical lens in line with the axis of rotation by repositioning the optical lens in a direction perpendicular to the axis of rotation,
   wherein the apparatus further includes at least one guiding device configured to guide the carrier element when the carrier element is displaced,
   wherein the carrier element is configured to receive the optical lens when the center of gravity of the optical lens is brought in line with the axis of rotation about which the turning device is rotatably mounted, and
   wherein the at least one guiding device includes guiding rods, wherein the guiding rods are guidable in a guiding shaft, surrounded by the carrier body, and wherein the guiding rods are configured to engage in the carrier element.

6. The method as claimed in claim 5, wherein the turning device is a turning ring.

7. The method as claimed in claim 5, wherein the optical lens is a spectacle lens, and wherein handling of the spectacle lens is implemented by the apparatus configured to introduce the optical lens into the turning device.

8. The method as claimed in claim 7, wherein the optical lens is a spectacle lens, the method further comprising:
   coating a first side of the spectacle lens;
   turning the spectacle lens having the coating on the first side with the turning device; and
   coating a second side of the spectacle lens.

* * * * *